United States Patent
Thierry et al.

(10) Patent No.: US 6,748,245 B1
(45) Date of Patent: Jun. 8, 2004

(54) METHOD FOR MANAGING POWER SUPPLY TO A CELLULAR RADIOTELEPHONE STATION

(75) Inventors: Jean-Paul Thierry, Osny (FR); Marc Porato, Loconville (FR); Jean-Marc Dimech, Chaumont en Vexin (FR); Frédéric Heurtaux, Le Puy Sainte Reparade (FR)

(73) Assignee: Sagem SA, Paris (FR)

( * ) Notice: Subject to any disclaimer, the term of this patent is extended or adjusted under 35 U.S.C. 154(b) by 0 days.

(21) Appl. No.: 09/508,449
(22) PCT Filed: Sep. 25, 1998
(86) PCT No.: PCT/FR98/02063
§ 371 (c)(1),
(2), (4) Date: May 18, 2000
(87) PCT Pub. No.: WO99/17462
PCT Pub. Date: Apr. 8, 1999

(30) Foreign Application Priority Data

Sep. 26, 1997 (FR) .............................................. 97 12004

(51) Int. Cl.⁷ ................................................ H04B 1/38
(52) U.S. Cl. ...................................... 455/572; 455/574
(58) Field of Search ................................ 455/572, 573, 455/574, 127, 522, 69, 127.1, 115.3, 115.4

(56) References Cited

U.S. PATENT DOCUMENTS

| 5,465,399 | A | | 11/1995 | Oberholtzer et al. |
| 5,828,953 | A | * | 10/1998 | Kawase ........................ 455/127 |
| 5,835,846 | A | * | 11/1998 | Furukawa et al. ............. 455/69 |
| 5,870,685 | A | * | 2/1999 | Flynn ........................... 455/573 |
| 6,072,784 | A | * | 6/2000 | Agrawal et al. ............. 370/311 |

FOREIGN PATENT DOCUMENTS

WO    96 34461 A    10/1996

* cited by examiner

Primary Examiner—Nay Maung
Assistant Examiner—Tu Nguyen
(74) Attorney, Agent, or Firm—Greenberg Traurig LLP; Eugene C. Rzucidlo

(57) ABSTRACT

The process for controlling the power supply (16) of a telephone (1) of a cellular radiotelephone network (2), of which the transmission power (13) is controlled (14) by the network (2) according to a power class indicated by the telephone (1), consists of determining the charge level of the power supply (16), deducing the maximum transmission power able to be reached, according to the charge level, comparing the maximum transmission power and the transmission power controlled (14) by the network (2), and downgrading the mobile telephone (1) if the former is lower than the latter (14).

10 Claims, 1 Drawing Sheet

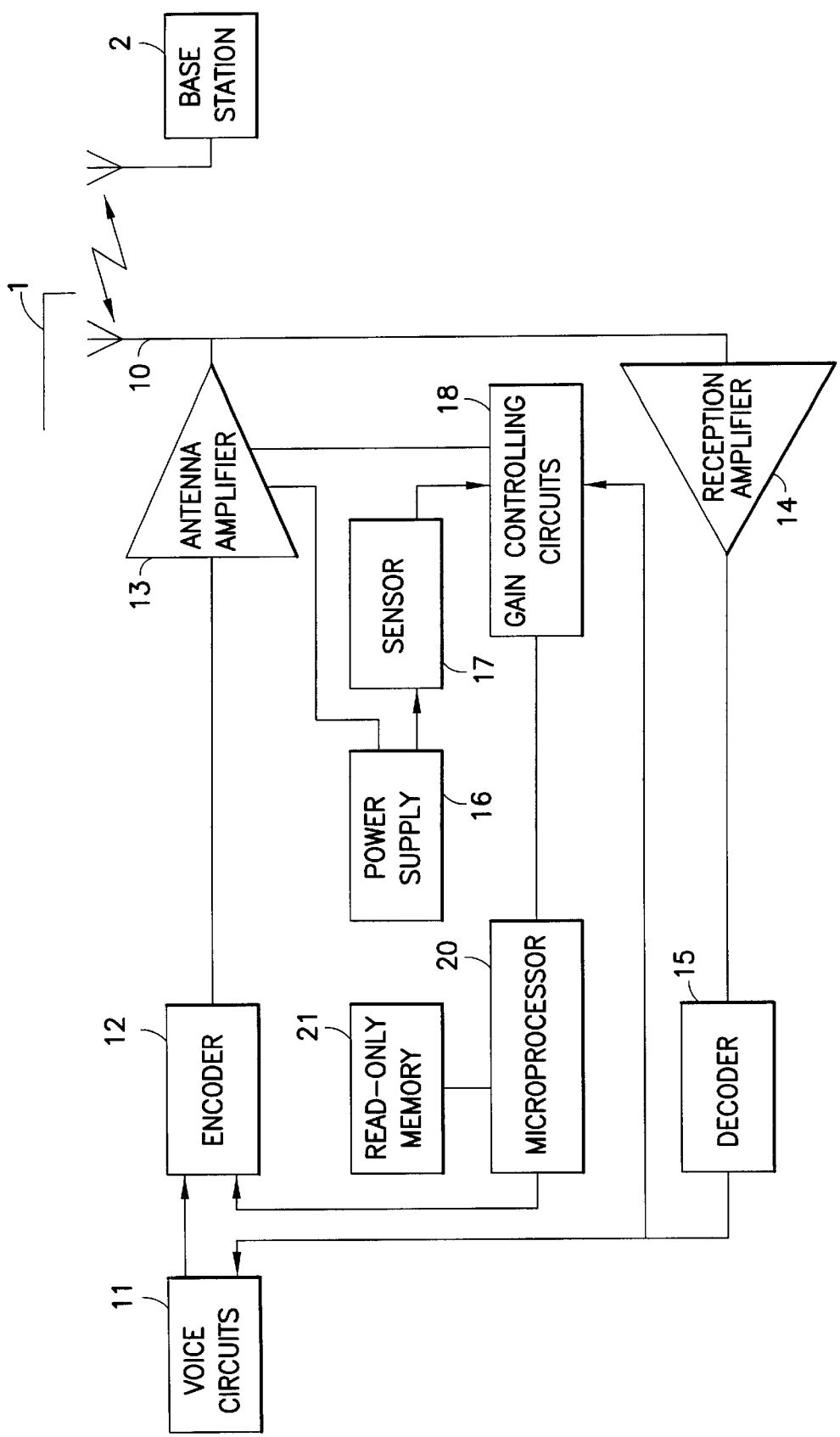

METHOD FOR MANAGING POWER SUPPLY TO A CELLULAR RADIOTELEPHONE STATION

In a cellular radiotelephone network, such as the GSM network, the mobile telephones transmit to the base stations at a power level which depends on the construction characteristics of each type of telephone and which are defined by a power class.

This class is stored in the telephone and, when it is energised, it announces itself to the network by automatically transmitting this class and various data indicating its characteristics and its functions. When communication is established, the network controls the level of transmission of the telephone according to this class, ie. in the case of low reception at the base station linked to the telephone, the network will attempt to remotely control an increase in the transmission level of the telephone only if the maximum transmission level associated with its class has not already been reached. Otherwise the network will simply attempt to correct the errors in reception.

As long as the maximum level has not been reached the network remotely controls the level of transmission of the telephone so that this will be just sufficient to avoid errors, this avoids wasting the telephone's power and is thus advantageous to its autonomy.

The radio transmission represents a large part of the telephone's consumption, it having very limited autonomy in the power supply, batteries or cells, storing electrical power. In the case of severe discharging, the power supply is incapable of supplying the desired current and must be changed or recharged.

The present invention aims to prolong the "lifespan" of such a power supply, ie. to increase the quantity of useful power that it is possible to extract therefrom between two recharges, if this is the case.

To this end, the invention relates to a process for controlling the power supply of a telephone of a cellular radiotelephone network, of which the transmission power is controlled by the network according to a nominal power class indicted by the telephone, characterised in that the charge level of the power supply is determined, the maximum transmission power able to be reached is deduced from the charge level, the maximum transmission power and the transmission power controlled by the network are compared, and the mobile telephone is downgraded if the former is lower than the latter.

Thus, when the power supply becomes incapable of providing the desired power it is possible to proceed with the extraction of power therefrom in a downgraded mode of operation which requires less power.

The telephone is advantageously downgraded into a fictitious class of transmission power lower than that of the nominal class.

It is thus possible to return to standard operation with automatic power control but in a lower range of transmission power levels.

In this case any connection between the telephone and the network is preferably cut in order then to reestablish such a connection and to transmit the indication relative to the fictitious class.

The switching between classes thus does not risk disrupting the network since this network cannot establish a logic link between the telephone which has "disappeared" and the same telephone reappearing with immediately reduced power.

The invention will be better understood with the aid of the following description of a preferred embodiment of the process of the invention and with reference to the single figure which schematically shows a radiotelephone for implementation of the process of the invention and a radio base station.

The telephone 1 of the cellular radiotelephone network can be connected to a base station 2 of the network, in this case the GSM. The telephone 1 comprises a standard assembly 11 of voice circuits: analogue interface circuits, loudspeaker, microphone, the latter controlling, via an encoder 12, an antenna amplifier 13 charged by a transmission-reception antenna 10.

In reception, the antenna 10 controls a reception amplifier 14 controlling the loudspeaker of the circuit 11 via a decoder 15.

The group of circuits illustrated is supplied by a power source 16 storing electrical power, in this case a group of cells. The power supply 16 thus supplies, in particular, the amplifier 13 having adjustable transmission power controlled by a circuit 18 for controlling gain, or power level, which is itself controlled by the output of the decoder 15 which, amongst other things, receives, to this end, remote commands from the station 2.

The charge level of the power supply 16 is monitored by a sensor 17 connected at the output to the circuit 18. The sensor 17 in this case measures the voltage of the power supply 16; in other examples an ammeter could be provided or even a temperature sensor which is already provided for safety reasons.

Furthermore, a microprocessor 20, controlling all the circuits, is connected to a read-only memory 21, containing data for identifying the terminal 1, which can be read by the encoder 12 via the microprocessor 20.

The operation of the telephone 1 is as follows, with respect to the control of the power supply 16.

When the telephone 1 is active and receives remote commands for control of the level of transmission (13), the charge level of the power supply 16 is determined, the maximum transmission power able to be reached is deduced from the charge level, the maximum transmission power and the transmission power (14) controlled by the network 2 are compared, and the mobile telephone 1 is downgraded if the former is lower than the latter (14).

The downgrading can consist of adopting another predetermined class, passing from 2 watts to 0.8 watts, for example, or simply of not reaching the desired transmission level by refusing to carry out the remote commands without the actual transmission level or the maximum level necessarily corresponding to a predetermined class. In this latter case, transmission will preferably be carried out at the maximum possible level taking account of the charge level of the power supply in order to best approach the level expected by the station 2.

On the other hand, in the case where there is a transition to a specific lower class, the level required by the station 2 will be reduced after the telephone 1 transmits the new class to it, so that the remote commands (for increase) of the level of power which it transmits will be executed again since a safety margin will have been re-established by the lowering of the class. The process of class reduction can continue to other, lower classes. During the downgrading the network can, for example, allocate the telephone 1 to another station closer to it than the station 2, even if this other station is more busy, in order to improve the quality of the connections.

The process of controlling the power supply 16 will be explained in more detail.

When the telephone 1 is energised, it announces itself to the station 2 by transmitting its identification data contained in the memory 21. The network 2 thus knows the class of the telephone 1, ie. the maximum power which it can request it to transmit. When the telephone 1 is moving, the network 2 can thus remotely control the circuit 18 to adjust the transmission power (13) to a level sufficient for good reception at the station 2 without, however, wasting power by using an excessive level of transmission.

If the station 2 only receives too low a level from the telephone 1, it transmits a remote command to raise the transmission level (13) again. If, in the case of interest here, the power supply 16 has a charge level insufficient to provide the transmission power corresponding to the desired level, the telephone 1 is then downgraded.

In this case the charge level is estimated according to the voltage of the power supply 16 which falls as it is discharged. The circuit 17 measures, in particular, the at-rest voltage, with low discharge, in the absence of transmission, which provides a first estimation of the charge level, and also measures the voltage at high output, during transmission, which provides a second indication of the charge level, by estimating, in fact, the internal resistance of the power supply 16 since the current absorbed normally by the antenna 10 and the various circuits is known.

The circuit 18 then exploits these measurements to accept or reject a remote command aiming to increase the transmission level. In order to modify the class announced to the network 2, the circuit 18 controls the microprocessor 20 which then transmits an indication of a fictitious class (or of maximum power) lower than that in the memory 21. Provision can be made for the power supply of the telephone 1 to be cut, or for the microprocessor 20 to control such a cut by a switch, not shown, telephone 1 which thus "disappears" from the network 2 in order then to reappear by reestablishment of its power supply, announcing the fictitious class thereof, in this case 0.8 watts, which avoids the risk of disrupting the network 2 by a transition of classes which it would detect if the connection thereto were maintained. In a variation, it will suffice simply to cut and then to reestablish the connection between the telephone 1 and the network 2.

If the discharge of the power supply 16 is too great, it is also possible to prevent any transmission of voice signals and to maintain only the reception of messages from the network 2, for example short written messages, ie. any outgoing call is prevented while the transmissions of signals to control the incoming calls is permitted. The telephone 1 thus operates as a receiver of messages (pager), its user being informed of the identity of the correspondents who are calling it.

The telephone number identifying the calling telephone is then detected in the messages received, formed from the message sent by the calling telephone and signals identifying it, and it is applied to user-machine interface means such as a display or voice synthesiser.

In order to economise further on energy it is even possible to prevent any transmission, even of signals for controlling incoming calls. The arrival of a call is simply detected and signalled by a means of the type indicated above, for example, a buzzer.

In practice the control circuit 18 can exist only functionally, ie. can be integrated into the microprocessor 20 or into an equivalent central unit controlling the adjustment of the transmitter 13 in a time-sharing manner.

What is claimed is:

1. Process for controlling the power supply (16) of a mobile telephone (1) of a cellular radiotelephone network (2), of which the transmission power (13) is controlled (14) by the network (2) according to a power class indicated by the telephone (1), the process being characterised in that the charge level of the power supply (16) is determined, the maximum transmission power able to be reached is deduced from the charge level, the maximum transmission power and the transmission power controlled (14) by the network (2) are compared, and the mobile telephone (1) is downgraded if the former is lower than the latter (14).

2. Process according to claim 1, wherein in order to be downgraded, the telephone (1) rejects the power command of the network.

3. Process according to claim 1, wherein the telephone (1) is downgraded into a fictitious class of transmission power lower than that of the nominal class.

4. Process according to claim 3, wherein any connection between the telephone (1) and the network (2) is cut in order then to reestablish such a connection and transmit the indication relating to the fictitious class.

5. Process according to claim 4, wherein the connection is cut by cutting the power supply (16) of the telephone (1).

6. Process according to claim 1, wherein the maximum transmission power is estimated according to the current output by the power supply (16).

7. Process according to claim 2, wherein the maximum transmission power is estimated according to the current output by the power supply (16).

8. Processing according to 3, wherein the maximum transmission power is estimated according to the current output by the power supply (16).

9. Process according to claim 4, wherein the maximum transmission power is estimated according to the current output by the power supply (16).

10. Process according to claim 5 wherein the maximum transmission power is estimated according to the current output by the power supply (16).

* * * * *